(12) United States Patent
Liu

(10) Patent No.: US 6,800,869 B2
(45) Date of Patent: Oct. 5, 2004

(54) MONITORING APPARATUS AND METHOD FOR TAPE AUTOMATED BONDING PROCESS

(75) Inventor: Kang Ting Liu, Kaohsiung (TW)

(73) Assignee: Hannstar Display Corp. (TW)

( * ) Notice: Subject to any disclaimer, the term of this patent is extended or adjusted under 35 U.S.C. 154(b) by 582 days.

(21) Appl. No.: 09/941,548

(22) Filed: Aug. 30, 2001

(65) Prior Publication Data

US 2002/0140565 A1 Oct. 3, 2002

(30) Foreign Application Priority Data

Mar. 27, 2001 (TW) ........................................ 90107438 A

(51) Int. Cl.[7] ............................................... G01N 21/86
(52) U.S. Cl. ..................................... 250/559.4; 250/221
(58) Field of Search ............................... 250/559.4, 221, 250/559.29; 356/237.5, 237.4, 237.3, 239.8; 438/40, 673, 674; 377/3, 6

(56) References Cited

U.S. PATENT DOCUMENTS 5,696,032 A * 12/1997 Phelps et al. ................ 438/111

* cited by examiner

Primary Examiner—Que T. Le

(57) ABSTRACT

A monitoring apparatus for a tape automated bonding process, which is used to attach a plurality of flexible substrates constructed in the form of a tape to an edge of a rigid substrate, the monitoring apparatus comprises a sensor for sensing the variation of an optical signal and being moved along the edge of the rigid substrate so as to monitor the quantity of the flexible substrates according to the number of the variation of the optical signal.

15 Claims, 3 Drawing Sheets

MONITORING APPARATUS AND METHOD FOR TAPE AUTOMATED BONDING PROCESS

BACKGROUND OF THE INVENTION

1. Field of the Invention

The present invention generally relates to a monitoring apparatus and a method for tape automated bonding process, and more particularly to the monitoring apparatus that can monitor if the automated bonding process is correctly complete or not.

2. Description of the Related Art

Due to the advance of electronic technology, integrated circuit devices have been applied to various electronic products. In the manufacturing process of the electronic products, the tape automated bonding technology is usually utilized to electrically connect and mount the flexible substrate and electronic elements thereon to another rigid substrate by the anisotropic conductive adhesive/film. Typically, the anisotropic conductive adhesive/film is deposited between the electrically connecting point of the electronic element or the substrate and electrically connecting point of the flexible substrate, and the electrical connection therebetween can be formed by way of pre-curing process and post-curing process.

Moreover, with the advantages of low-energy consuming, low-heat dissipation, light-weight and non-luminescence display, liquid crystal displays (LCD) have been widely used in the electronic products and even have replaced the conventional cathode-ray tube (CRT) displays. In the manufacturing of the LCD, the driving circuits and controlling circuits usually are constructed as an electronic member of the type, such as integrated circuit, and are arranged on a continuous tape of flexible substrates which will be attached to an LCD panel by means of tape automated bonding technology.

In the attaching process, the flexible substrates are constructed in the form of a tape, and automatically attached to the LCD panel. In fact, in the manufacturing process of the tape and the electronic member attaching thereon, the electronic member may fail to be correctly attached on the flexible substrate, or the flexible substrate may be detached from LCD panel before the post-curing process, and the panel will be incorrectly assembled. In practical manufacturing process, the incorrectly assembled panel is usually detected after the post-curing process, and by this time the anisotropic conductive adhesive/film has to be removed before resuming the tape automated bonding process and final bonding process, thereby causing the material waste and cost increasing.

Accordingly, there exist needs for providing a monitoring apparatus used to detect assembling condition of flexible substrate in the tape automated bonding technology so as to decrease the difficulty of re-work.

SUMMARY OF THE INVENTION

It is a primary object of the present invention to provide a monitoring apparatus for the tape automated bonding process to confirm whether the automated bonding process is correctly accomplished or not.

It is another object of the present invention to provide a monitoring method for the tape automated bonding process to confirm whether the automated bonding process is correctly accomplished or not.

In order to achieve the objects mentioned hereinabove, the present invention provides a monitoring apparatus for the tape automated bonding process, which is used to attach a plurality of flexible substrates constructed in the form of a tape to an edge of a rigid substrate. The monitoring apparatus comprises a sensor for sensing the variation of an optical signal and being moved along the edge of the rigid substrate so as to monitor the quantity of the flexible substrates according to the number of the variation of the optical signal.

According to an aspect of the monitoring apparatus for the tape automated bonding process of the present invention, the rigid substrate is a glass substrate of the liquid crystal display.

According to another aspect of the monitoring apparatus for the tape automated bonding process of the present invention, the flexible substrate has the electronic member such as a driving integrated circuit or a controlling integrated circuit used for driving or controlling the LCD panel.

According to still another aspect of the monitoring apparatus for the tape automated bonding process of the present invention, the flexible substrate is mounted on the rigid substrate by means of isotropic conductive adhesive/film.

Accordingly, after the tape flexible substrate is mounted on the edge of the rigid substrate, the sense can monitor that the flexible substrate is abnormally installed or the flexible substrate do not correctly have the electronic member, and in such cases the warning device is actuated to warn the operator.

Other objects, advantages, and novel features of the invention will become more apparent from the following detailed description when taken in conjunction with the accompanying drawings.

DESCRIPTION OF THE PREFERRED EMBODIMENT

Figure 1:
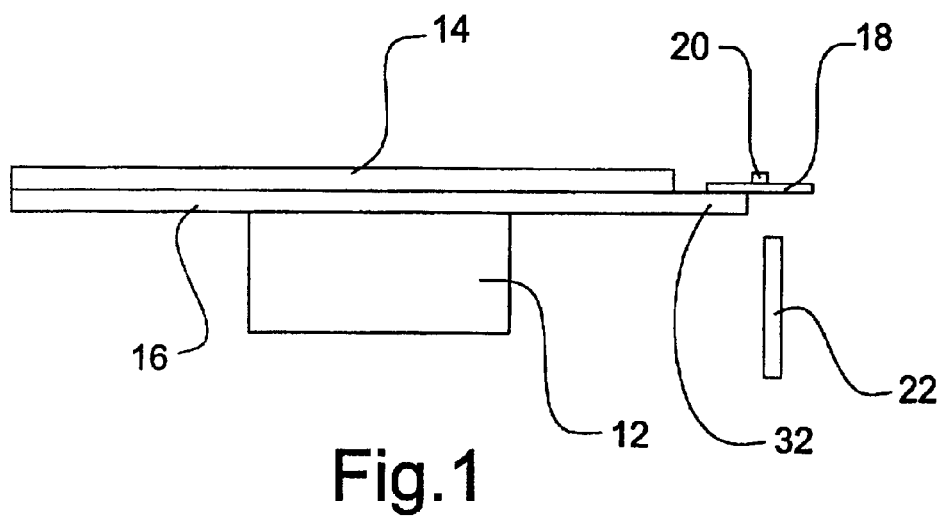
FIG. 1 is a side view of a monitoring apparatus according to an embodiment of the present invention which is used to monitor a tape automated bonding process of the LCD panel.

The present invention will now be described more fully hereinafter with the manufacturing of the liquid crystal display (LCD) device by way of an example, but it should be noted that the monitoring apparatus for the tape automated bonding process according to the present invention will not be limited thereto. Now referring to FIG. 1, it depicts a monitoring apparatus according to the present invention, which is used for monitoring the tape automated bonding process of an LCD panel.

The LCD panel is placed on the carrier 12, and generally consists of two transparent substrates 14 and 16, in which the upper substrate 14 is smaller than the lower substrate 16 such that a band shoulder 32 is formed on the edge of the lower substrate 16. The band shoulder 32 has pads which are electrically connected to a plurality of flexible substrates 18 by means of the anisotropic conductive adhesive/film.

Figure 2:
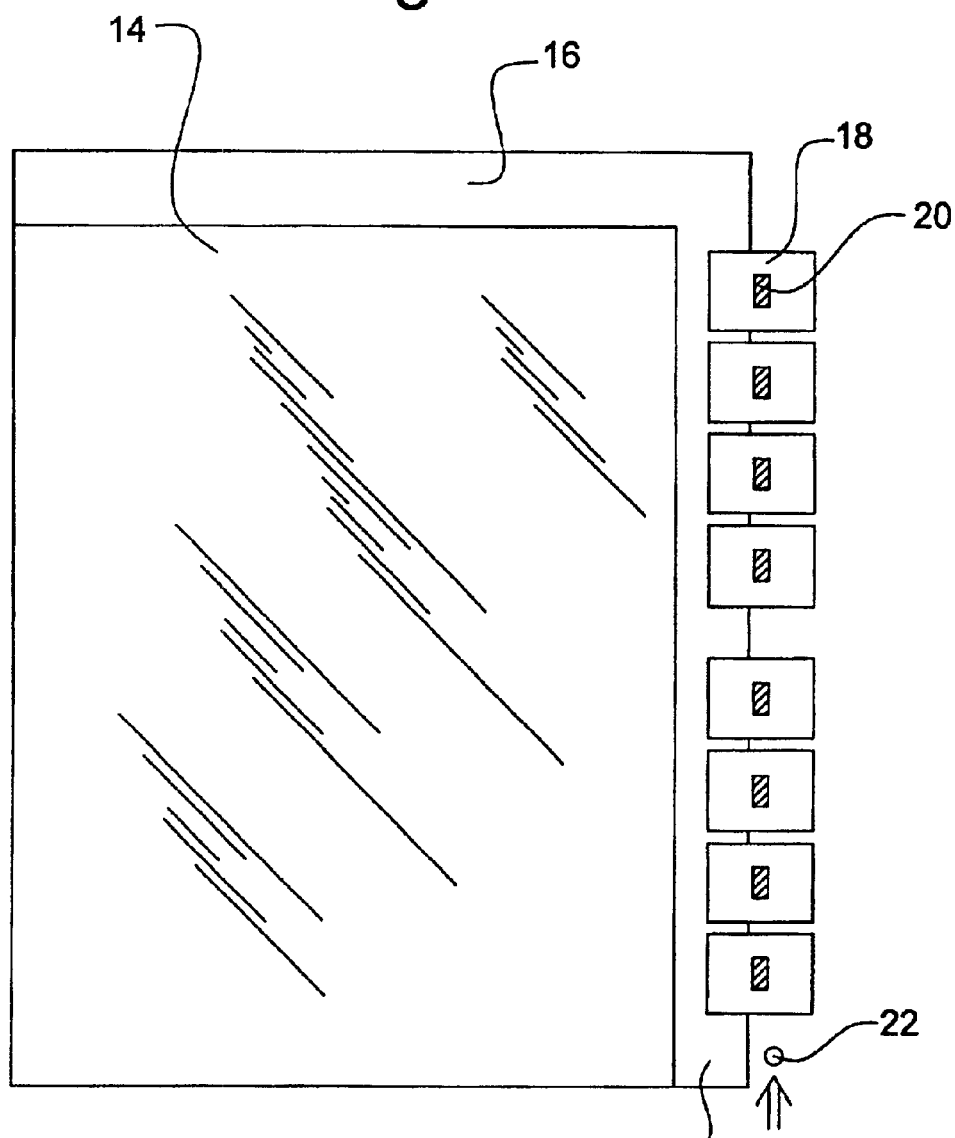
FIG. 2 is a top schematic view of an LCD panel to which flexible substrates are correctly attached.

Referring to FIG. 2, the flexible substrate 18 is generally constructed in the form of a tape, and has electronic members 20 such as integrated circuits thereon, which can be driving ICs and controlling ICs of an LCD panel used to deliver the driving or controlling signals to the LCD panel through the connecting pad on the lower substrate 16. As shown in the figure, the LCD panel has eight flexible substrates 18 attached on the shoulder 32 of the lower substrate 16. After the flexible substrates 18 are attached on the shoulder 32, the edge of the lower substrate 16 is scanned by means of the sensor 22 (as the arrow shown in the drawing) which can detect the variation of an optical signal and be connected to a processor to trigger a warning device while the abnormal condition happens. After the sensor 22 scans the edge of the lower substrate 16, the sensor 22 should detect the variations of the optical signal eight times.

Figure 3:
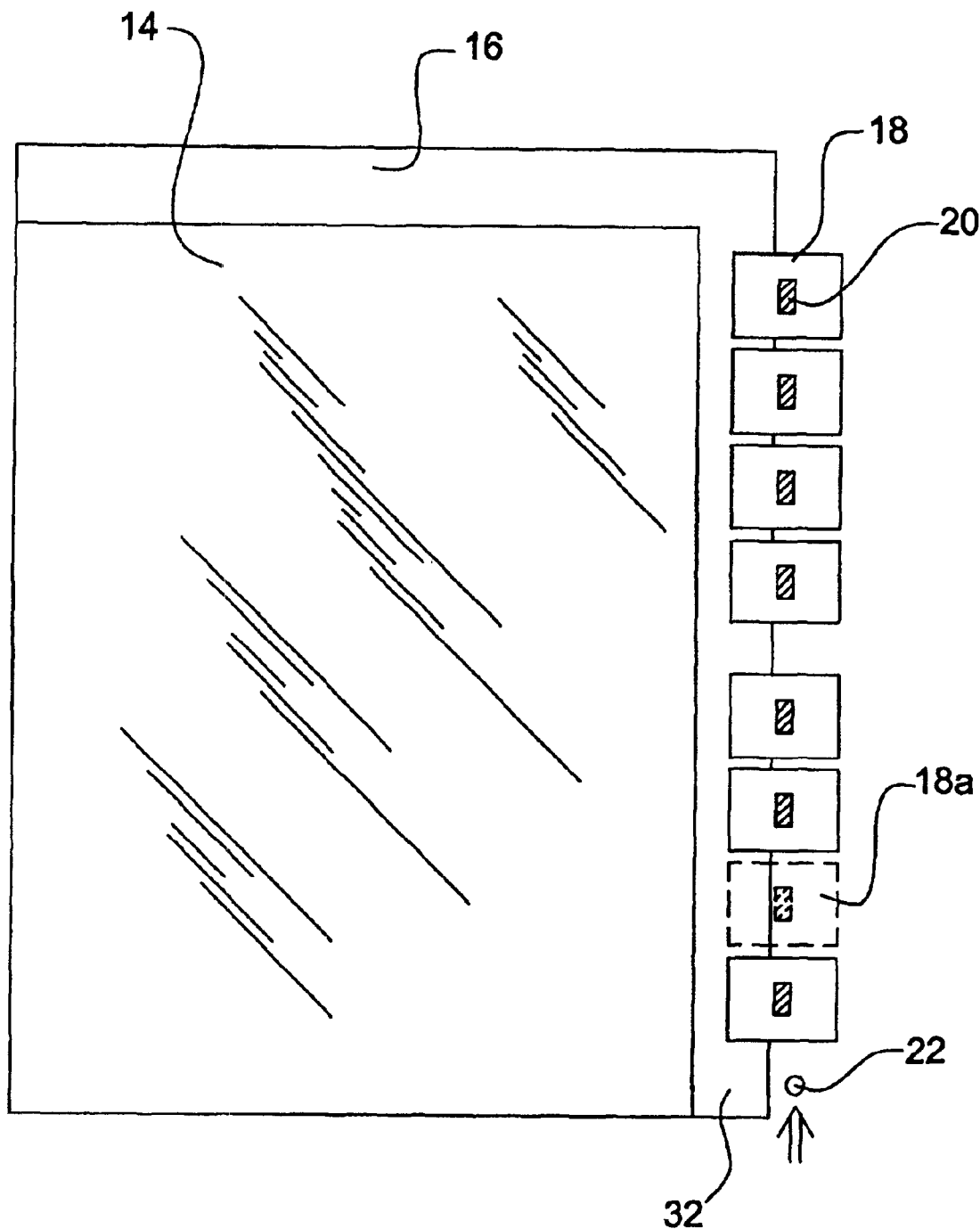
FIG. 3 is a top schematic view of an LCD panel to which flexible substrates are not correctly attached.

However, as shown in FIG. 3, if only seven flexible substrate 18 are attached to the LCD panel, namely, the flexible substrate 18a (as the dotted line shown in FIG. 3 shown) is lost or not attached, the sensor 22 would only detect the variations of the optical signal seven times, less than eight times in the normal conditions, and the processor would actuate the warning device to warn the operator that the abnormal condition in the tape automated bonding process has happened.

Figure 4:
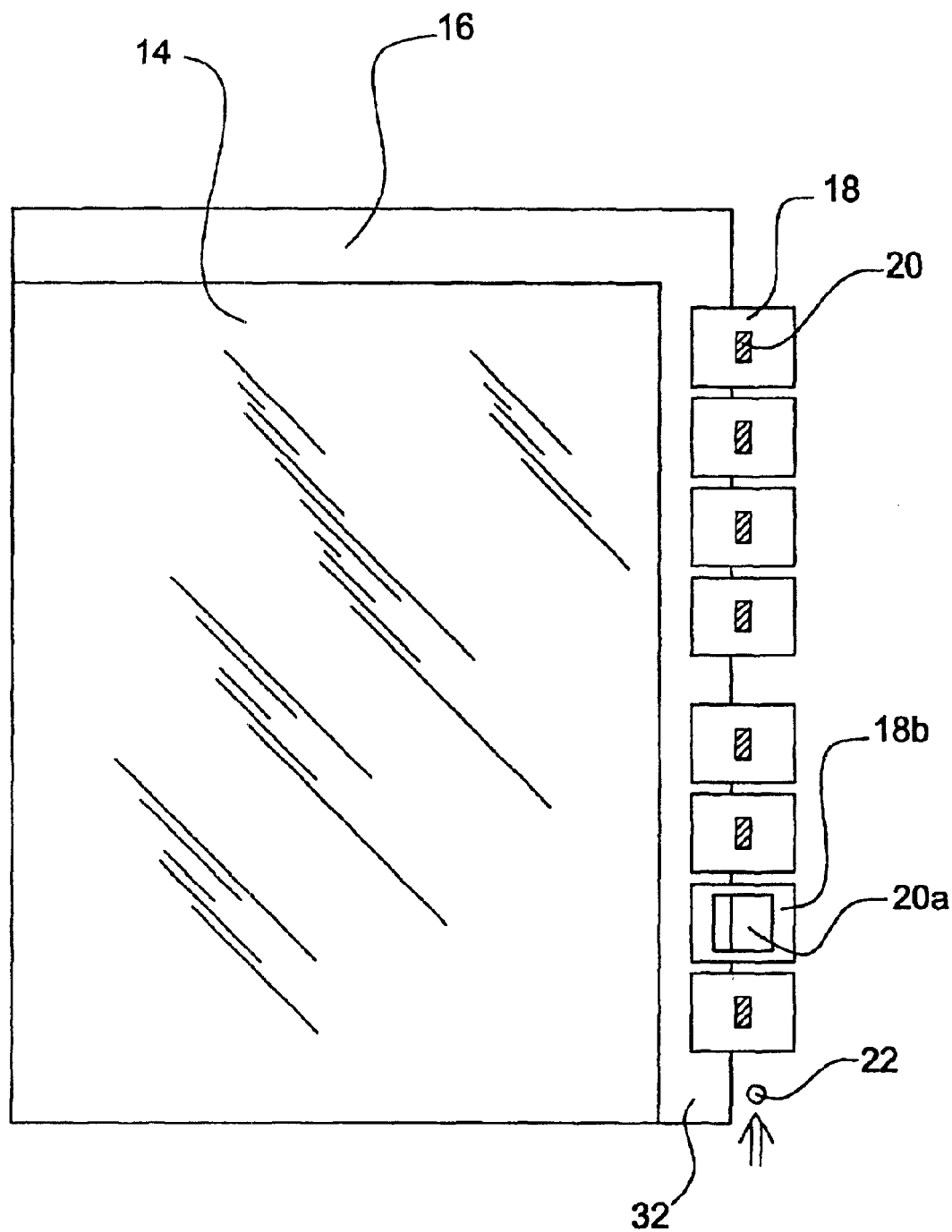
FIG. 4 is a top schematic view of another LCD panel to which flexible substrates are not correctly attached.

Moreover, in the manufacturing of the flexible substrate 18, the flexible substrate 18 is constructed in the form of a continuous tape. If the electronic member 20 is not correctly attached on the flexible substrate 18b, the manufacturer of the flexible substrate 18 will remove the part of the flexible substrate 18b on which the electronic member 20 is attached, and a square hole (as square hole 20a of the flexible substrate 18b shown in FIG. 4) therefore is formed to maintain the continuity of the tape of the flexible substrate 18. As shown in FIG. 4, while the flexible substrate 18b is attached on the LCD panel, the sensor 22 senses the variation of the optical signal nine times, higher than eight times in the normal conditions, and the processor actuates the warning device to warn the operator that the abnormal condition in the tape automated bonding process has happened.

As mentioned above, the operators can easily detect whether an abnormal condition occurs in the tape automated bonding process or not by means of the sensing apparatus described hereinabove, rather than the abnormal condition is not detected until accomplishing the curing process of anisotropic conductive adhesive/film so as to further reduce the difficulty of re-work of the LCD panel.

Although the invention has been explained in relation to its preferred embodiment, it is to be understood that many other possible modifications and variations can be made without departing from the spirit and scope of the invention as hereinafter claimed.

What is claimed is:

1. A monitoring apparatus for a tape automated bonding process, which is used to attach a plurality of flexible substrates constructed in the form of a tape to an edge of a rigid substrate, the monitoring apparatus comprising:

a sensor for detecting the variation of an optical signal and being moved along the edge of the rigid substrate so as to monitor the quantity of the flexible substrates according to the number of the variation of the optical signal.

2. A monitoring apparatus for a tape automated bonding process as claimed in claim 1, wherein the rigid substrate is a glass substrate of a liquid crystal display.

3. A monitoring apparatus for a tape automated bonding process as claimed in claim 1, wherein the tape flexible substrate has an electronic member disposed thereon.

4. A monitoring apparatus for a tape automated bonding process as claimed in claim 3, wherein the electronic member is a driving integrated circuit of a liquid crystal display panel.

5. A monitoring apparatus for a tape automated bonding process as claimed in claim 3, wherein the electronic member is a controlling integrated circuit of a liquid crystal display panel.

6. A monitoring apparatus for a tape automated bonding process as claimed in claim 3, wherein the tape flexible substrate is mounted on the rigid substrate by means of an isotropic conductive adhesive/film.

7. A monitoring apparatus for a tape automated bonding process as claimed in claim 3, further comprising:

a processor connected to the sensor; and a warning device connected to the processor, whereby when the processor detects the flexible substrate abnormally installed, the warning device is actuated.

8. A monitoring method for a tape automated bonding process, which is used to attach a plurality of flexible substrates constructed in the form of a tape to an edge of a rigid substrate, the monitoring apparatus comprising:

providing a sensor for detecting the variation of an optical signal;

providing a processor connected to the sensor;

moving the sensor along the edge of the rigid substrate on which the flexible substrates are attached; and monitoring the quantity of the flexible substrate by means of the processor counting the number of the variation of the optical signal.

9. A monitoring method for a tape automated bonding process as claimed in claim 8, wherein the rigid substrate is a glass substrate of the liquid crystal display.

10. A monitoring method for a tape automated bonding process as claimed in claim 9, wherein the tape flexible substrate has an electronic member disposed thereon.

11. A monitoring method for a tape automated bonding process as claimed in claim 10, wherein the electronic member is a driving integrated circuit of a liquid crystal display panel.

12. A monitoring method for a tape automated bonding process as claimed in claim 10, wherein the electronic member is a controlling integrated circuit of a liquid crystal display panel.

13. A monitoring method for a tape automated bonding process as claimed in claim 8, wherein the tape flexible substrate is mounted on the rigid substrate by means of an isotropic conductive adhesive/film.

14. A monitoring method for a tape automated bonding process as claimed in claim 8, further comprising the steps of:

providing a predetermined value; and comparing the number counted by the processor with the predetermined value, wherein when the number is not equal to the predetermined value, then the processor senses the flexible substrate abnormally installed.

15. A monitoring method for a tape automated bonding process as claimed in claim 14, wherein the processor is further connected to a warning device, whereby when the processor senses the flexible substrate abnormally installed, the warning device is actuated.

* * * * *